(12) United States Patent
Chen (10) Patent No.: US 7,679,910 B2
(45) Date of Patent: Mar. 16, 2010

(54) MINIATURIZED LIQUID COOLING DEVICE

(75) Inventor: Yen-Chih Chen, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 313 days.

(21) Appl. No.: 11/843,570

(22) Filed: Aug. 22, 2007

(65) Prior Publication Data

US 2009/0034194 A1 Feb. 5, 2009

(30) Foreign Application Priority Data

Aug. 3, 2007 (CN) .................. 2007 1 0075611

(51) Int. Cl.
*H05K 7/20* (2006.01)
(52) U.S. Cl. .............. 361/700; 361/679.53; 361/699; 165/80.4; 165/104.33
(58) Field of Classification Search ........... 361/679.53, 361/698–701; 165/80.4, 80.5, 104.33; 62/259.2; 257/714; 174/15.1, 15.2, 16.3, 252; 417/50
See application file for complete search history.

(56) References Cited

U.S. PATENT DOCUMENTS

| | | | | |
|---|---|---|---|---|
| 5,965,410 | A * | 10/1999 | Chow et al. ................. | 435/91.2 |
| 7,105,382 | B2 * | 9/2006 | Myers et al. ................. | 438/122 |
| 7,131,486 | B2 * | 11/2006 | Goodson et al. ............ | 165/80.4 |
| 7,149,085 | B2 * | 12/2006 | Chebiam et al. ............ | 361/699 |
| 7,185,697 | B2 * | 3/2007 | Goodson et al. ........ | 165/104.33 |
| 7,261,824 | B2 * | 8/2007 | Schlautmann et al. .......... | 216/2 |
| 7,316,543 | B2 * | 1/2008 | Goodson et al. .............. | 417/50 |

FOREIGN PATENT DOCUMENTS

CN 1588090 A 3/2005

* cited by examiner

Primary Examiner—Michael V Datskovskiy
(74) Attorney, Agent, or Firm—Frank R. Niranjan (57) ABSTRACT

A miniaturized liquid cooling device (200) includes a heat absorber (20), a heat dissipater (30), a droplet generator (40) driving a working fluid circulating between the heat absorber and the heat dissipater, and a plurality of tubes (50) connecting the heat absorber, the heat dissipater and the droplet generator with each other. The droplet generator includes a bottom electrode plate (42), a top electrode plate (44) hermetically covering the bottom electrode plate, a fluid channel (425) formed between and a plurality of control electrodes (422) disposed between the top electrode plate and the bottom electrode plate. The control electrodes are arranged between an inlet (481) and an outlet (491) of the droplet generator. Voltages are regularly applied across the control electrodes so as to generate a plurality of fluid droplets (D) and drive the fluid droplets to move from the inlet towards the outlet of the droplet generator.

14 Claims, 12 Drawing Sheets

MINIATURIZED LIQUID COOLING DEVICE

CROSS-REFERENCE TO RELATED APPLICATION

This application is related to co-pending U.S. patent application Ser. No. 11/836,734, filed on Aug. 9, 2007, and entitled "INK-JET HEAD AND PRINTER USING THE SAME". The co-pending U.S. patent application is assigned to the same assignee as the instant application. The disclosure of the above-identified application is incorporated herein by reference.

BACKGROUND OF THE INVENTION

1. Field of the Invention

The present invention relates generally to liquid cooling devices, and more particularly to a miniaturized liquid cooling device and a droplet generator used in the miniaturized liquid cooling device.

2. Description of Related Art

Along with fast developments in electronic information industries, electronic components such as central processing units (CPUs) of computers are capable of operating at much higher frequencies and speeds. As a result, the heat generated by the CPUs during normal operation is commensurately increased. If not quickly removed away from the CPUs this generated heat may cause them to become overheated and finally affect the workability and stability of the CPUs.

In order to remove the heat of the CPUs and hence keep the CPUs in normal working order, cooling devices must be provided to the CPUs to dissipate heat therefrom. Conventionally, extruded heat sinks combined with electric fans are frequently used for this heat dissipation purpose. These conventional cooling devices are sufficient for CPUs with low frequencies, but are unsatisfactory for cooling the current CPUs with high frequencies. Liquid cooling devices with high heat dissipation efficiencies are used for dissipating heat generated by high frequency CPUs.

The liquid cooling device includes a heat absorber absorbing heat from the CPU, a heat dissipater dissipating the heat to surrounding environment, a pump driving working fluid to circulate between the heat absorber and the heat dissipater, and a plurality of tubes connecting the heat absorber and the heat dissipater. The liquid cooling device satisfies the heat dissipation requirements of the high frequency CPU. However, the pump occupies a large volume, which increases the size of the liquid cooling device. This goes against the need for compact size in electronic products. Therefore, there is a need for a miniaturized liquid cooling device.

SUMMARY OF THE INVENTION

The present invention relates, in one aspect, to a miniaturized liquid cooling device. The miniaturized liquid cooling device includes a heat absorber, a heat dissipater, a droplet generator driving a working fluid circulating between the heat absorber and the heat dissipater and dividing the working fluid into fluid droplets when the working fluid flows therethrough, and a plurality of tubes connecting the heat absorber, the heat dissipater and the droplet generator with each other. The droplet generator occupies a small size, which decreases the size of the entire liquid cooling device in such a way that the liquid cooling device can be adapted for use in compact electronic products such as laptop computers.

The present invention relates, in another aspect, to a droplet generator used in the miniaturized liquid cooling device. The droplet generator includes a bottom electrode plate, a top electrode plate hermetically covering the bottom electrode plate, a fluid channel formed between the top electrode plate and the bottom electrode plate, and a plurality of control electrodes disposed between the top electrode plate and the bottom electrode plate. The control electrodes are arranged between an inlet and an outlet of the droplet generator. Voltages are regularly applied across the control electrodes so as to generate a plurality of fluid droplets and drive the fluid droplets to move from the inlet towards the outlet of the droplet generator.

Other advantages and novel features of the present invention will become more apparent from the following detailed description of preferred embodiments when taken in conjunction with the accompanying drawings, in which:

DETAILED DESCRIPTION OF THE INVENTION

Reference will now be made to the drawing Figures to describe the preferred embodiment in detail.

Figure 1:
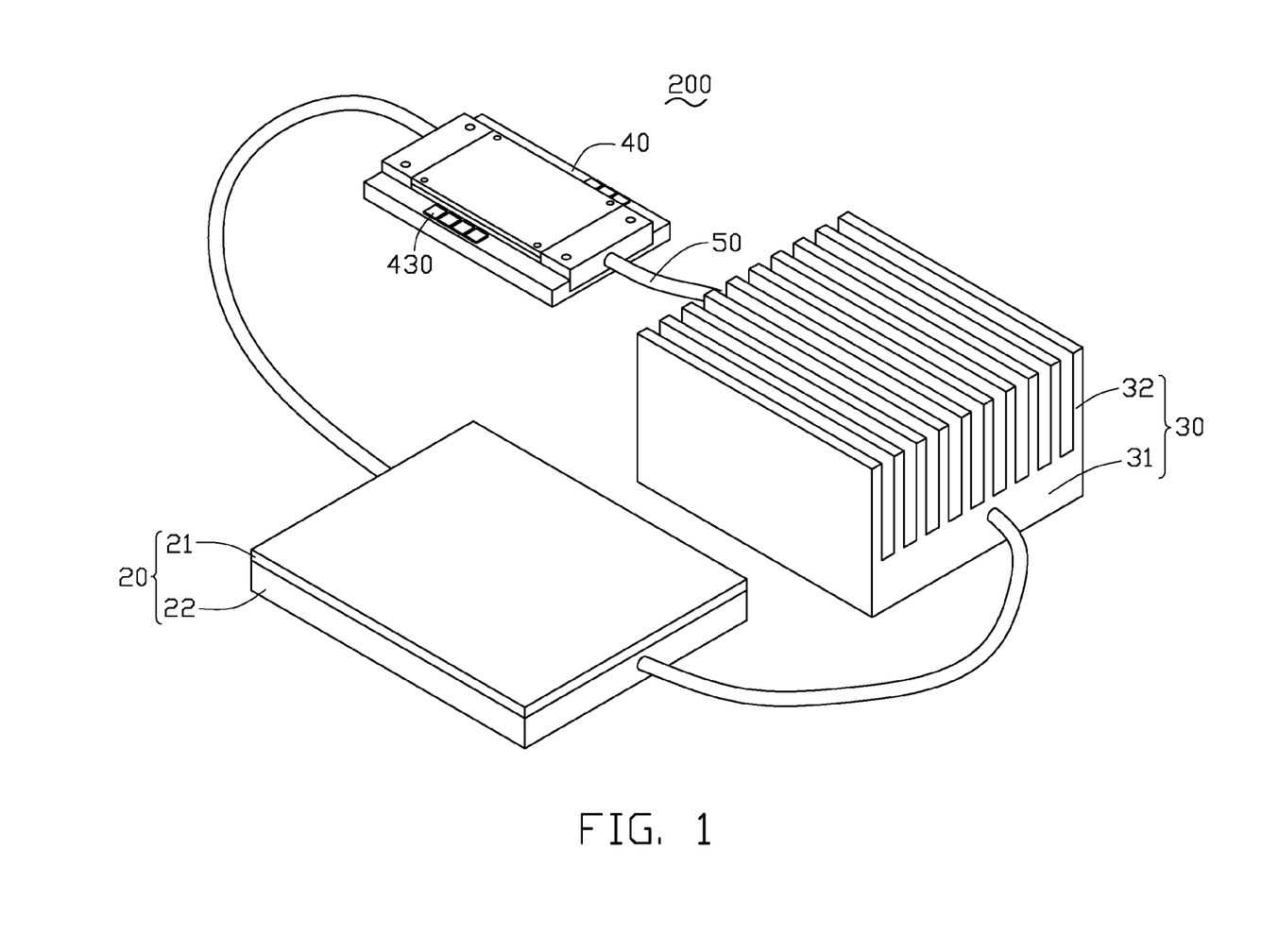
FIG. 1 is an assembled view of a miniaturized liquid cooling device in accordance with a preferred embodiment of the present invention.
Figure 2:
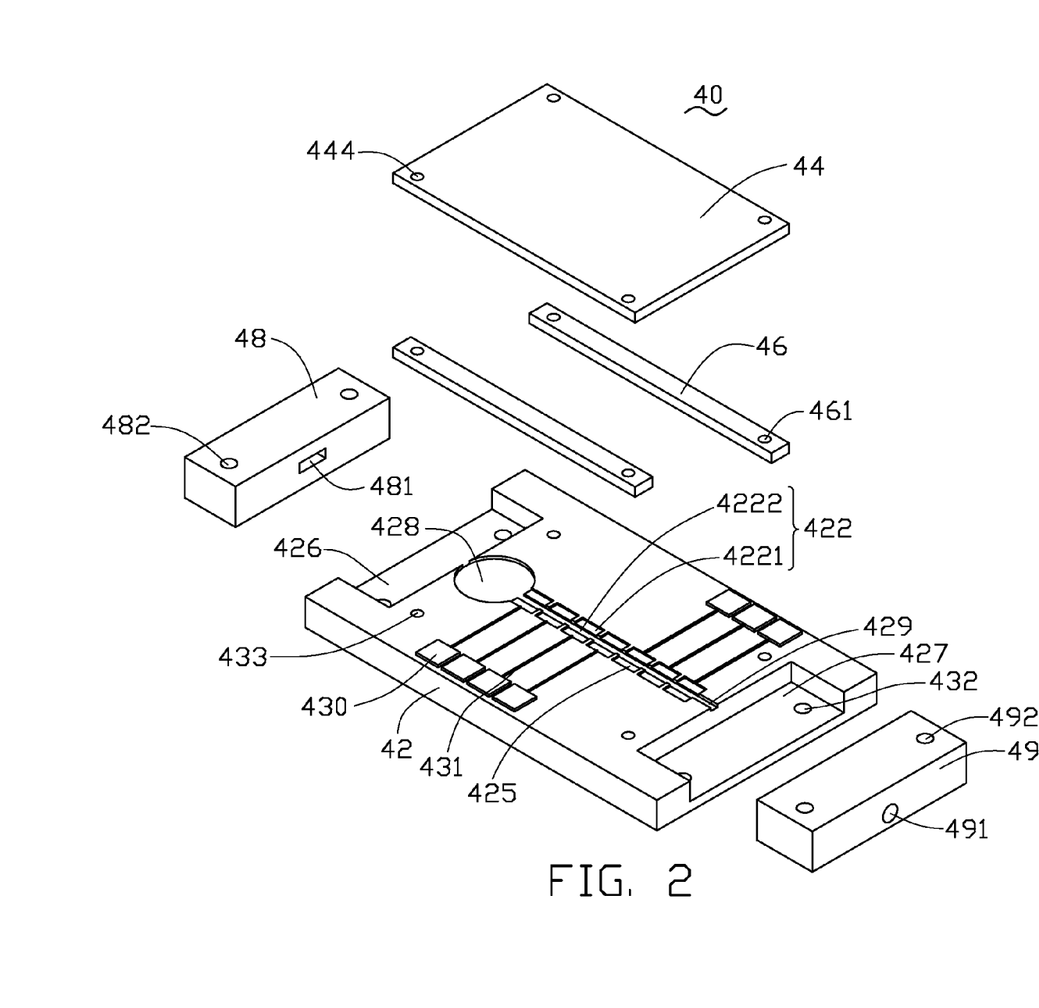
FIG. 2 is an exploded, isometric view of a droplet generator of the miniaturized liquid cooling device of FIG. 1.

Referring to FIGS. 1 and 2, a miniaturized liquid cooling device 200 according to a preferred embodiment of the present invention is shown. The liquid cooling device 200 includes a heat absorber 20, a heat dissipater 30, a miniaturized droplet generator 40 and a plurality of tubes 50. The heat absorber 20, the heat dissipater 30 and the droplet generator 40 connect with each other via the tubes 50 in such a way that a loop containing a working fluid is formed.

The heat absorber 20 thermally connects with a heat generating electronic component (not shown). The working fluid in the heat absorber 20 absorbs heat from the heat generating electronic component and is therefore heated. The droplet generator 40 drives the heated working fluid to flow towards the heat dissipater 30. The heated working fluid is cooled at the heat dissipater 30 and driven to flow back to the heat absorber 20 to form a circuit.

The heat absorber 20 is a rectangular shaped heat absorbing block. The heat absorber 20 includes a bottom base 22 defining a fluid passage (not shown) therein and a top cover 21 covering the bottom base 22. Inlet and outlet of the fluid passage respectively connect with the heat dissipater 30 and the droplet generator 40 via the tubes 50.

The heat dissipater 30 is a heat sink including a base 31 and a plurality of fins 32 extending upwardly from the base 31. The base 31 of the heat dissipater 30 defines a fluid passage (not shown) therein. Inlet and outlet of the fluid passage respectively connect with the droplet generator 40 and the heat absorber 20 via the tubes 50. A plurality of heat dissipating posts may be arranged in the fluid passage of the heat dissipater 30 for increasing heat exchange efficiency between the heat dissipater 30 and the working fluid.

Figure 3:
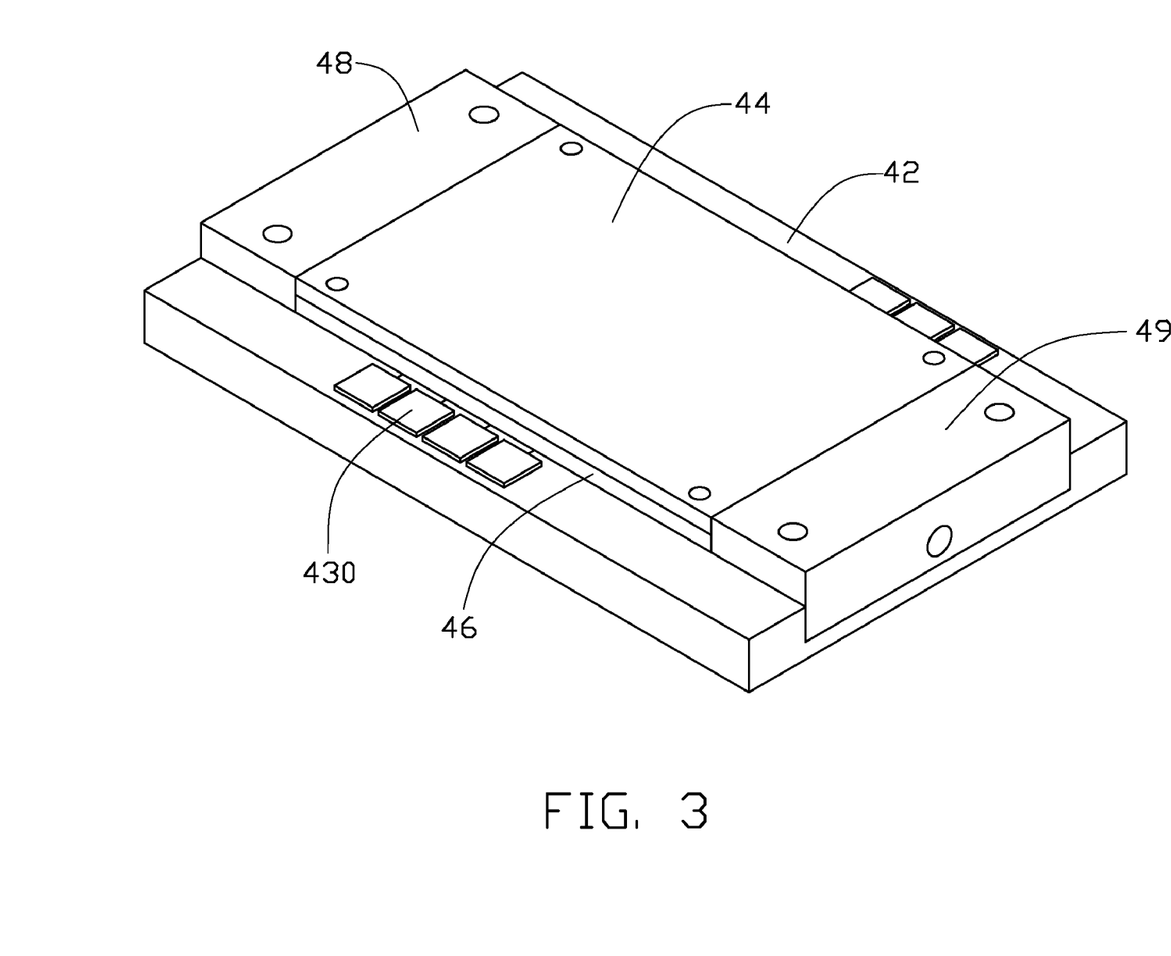
FIG. 3 is an assembled view of the droplet generator of FIG. 2.

Referring to FIGS. 2 and 3, the droplet generator 40 includes a bottom electrode plate 42, a top electrode plate 44 hermetically covering the bottom electrode plate 42, control circuits (not shown) electrically connecting the bottom electrode plate 42 with the top electrode plate 44, two elongated supporting members 46 sandwiched between the top electrode plate 44 and the bottom electrode plate 42, and first and second sealing blocks 48, 49 sealing a fluid channel 425 formed between the top and the bottom electrode plates 44, 42 and the supporting members 46.

The bottom electrode plate 42 is rectangular shaped in profile and defines first and second openings 426, 427 at two opposite ends thereof. The first and the second sealing blocks 48, 49 are respectively received in the first and the second openings 426, 427, and seal two opposite sides of the bottom electrode plate 42. The first and the second sealing blocks 48, 49 and the bottom electrode plate 42 respectively define mounting holes 482, 492, 432 therein, for fixing the first and the second sealing blocks 48, 49 to the bottom electrode plate 42. The first and the second sealing blocks 48, 49 respectively define an inlet 481 and an outlet 491 for the droplet generator 40. A plurality of spaced control electrodes 422 are arranged on a top surface of the bottom electrode plate 42 along a longitudinal direction thereof. An elongated fluid slot 429 is defined at a middle portion of and extends along the longitudinal direction of the bottom electrode plate 42. A fluid storage pool 428 is defined between the leftmost control electrode 422 and the first opening 426. The fluid storage pool 428 communicates the inlet 481 of the droplet generator 40 defined in the first sealing block 48 with a left end of the fluid slot 429, whilst a right end of the fluid slot 429 communicates with the outlet 491 of the droplet generator 40 defined in the second sealing block 49. A width of the fluid slot 429 is so tiny that a capillary force can be generated which wicks a part of the working fluid entering into the fluid slot 429.

The fluid slot 429 divides each of the control electrodes 422 into three parts, i.e. two parallel parts 4221 at two opposite sides of the fluid slot 429 and a part 4222 in the fluid slot 429. The control electrodes 422 respectively connect with a plurality of electric terminals 430 via a plurality connecting units 431. The electric terminals 430 are positioned at two opposite sides of the bottom electrode plate 42. Alternatively, the electric terminals 430 can merely be positioned at one side of the bottom electrode plate 42. The supporting members 46 are respectively placed adjacent to the opposite sides of the bottom electrode plate 42 via mounting elements (not shown) extending through mounting holes 444, 461, 433 of the top electrode plate 44, the supporting members 46 and the bottom electrode plate 42. The fluid channel 425 is formed between a bottom surface of the top electrode plate 44, opposite inner surfaces of the supporting members 46 and the top surface of the bottom electrode plate 42, and has a width substantially equal to a width of each of the control electrodes 422. The electric terminals 430 are disposed outside the supporting members 46 so that the electric terminals 430 can connect with the control circuits.

Figure 4:
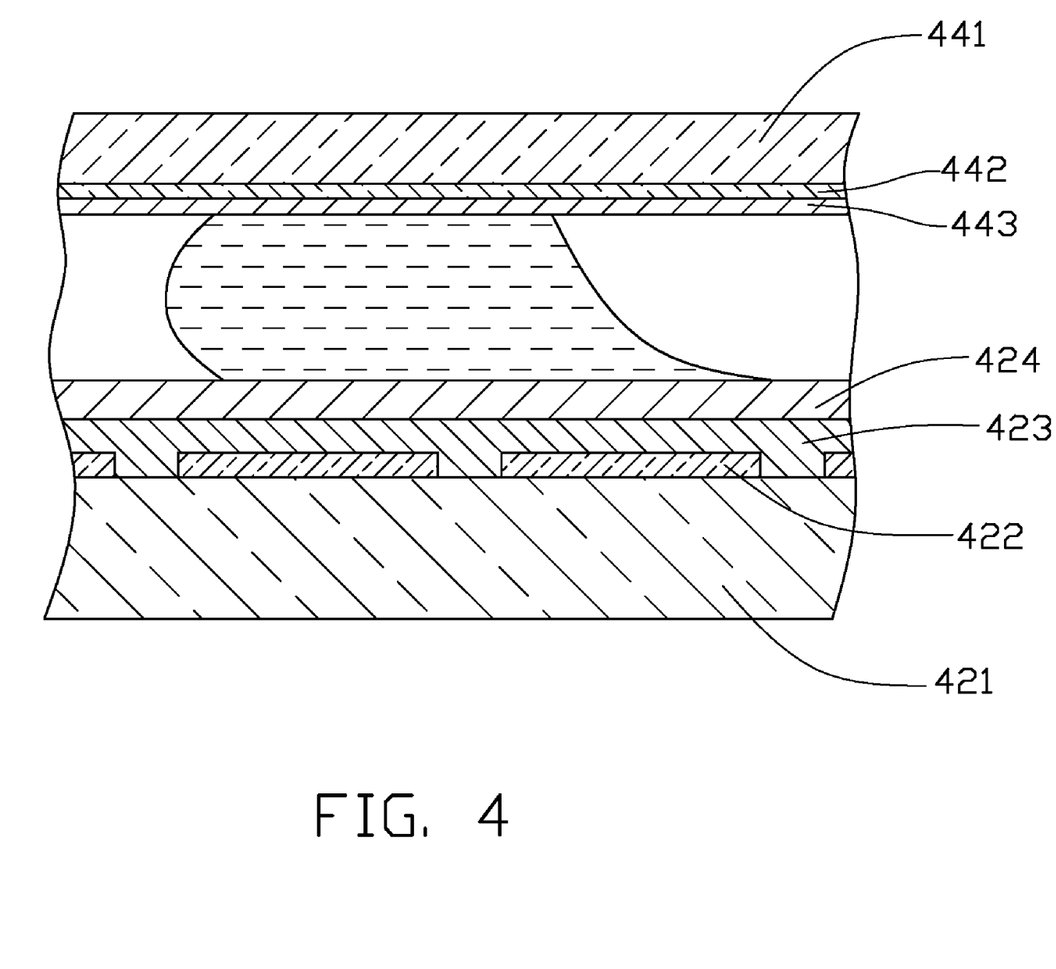
FIG. 4 is a part of a cut-away view of the droplet generator of FIG. 3, showing the part corresponding to a liquid channel of the droplet generator.

Referring to FIG. 4, as viewed from the cut-away view, the bottom electrode plate 42 includes a substrate 421 made of glass. Alternatively, the substrate 421 can be made of silicone. The first and the second openings 426, 427, the fluid storage pool 428, the fluid slot 429 and the mounting holes 432, 433 are made in the substrate 421 via mechanic manufacturing or wet etching method. A conductive and transparent ITO (indium tin oxide) glass layer is deposited on a top surface of the substrate 421 via chemical vapor deposition. The ITO glass layer is etched via photochemical etching so as to form the control electrodes 422, the connecting units 431 and the electric terminals 430. A dielectric layer 423 made of silicone nitride ($Si_3N_4$) is deposited on top surfaces of the control electrodes 422, the connecting units 431, and the electric terminals 430 via chemical vapor deposition method. A hydrophobic layer 424 made of Teflon is coated on the dielectric layer 423 via spin coating method, so that the working fluid cannot permeate to wet the control electrodes 422.

The top electrode plate 44 is rectangular shaped in profile and includes a substrate 441 made of glass. Alternatively, the substrate 441 can be made of silicone. The mounting holes 444 are made in the substrate 441 via mechanical manufacturing or wet etching. A reference electrode layer 442 made of conductive and transparent ITO (indium tin oxide) glass is deposited on a bottom surface of the substrate 441 via chemical vapor deposition. A hydrophobic layer 443 made of Teflon is applied on the reference electrode layer 442 via spin coating, so that the working fluid cannot permeate to wet the reference electrode layer 442. Alternatively, a dielectric layer made of silicone nitride ($Si_3N_4$) can be deposited between the reference electrode layer 442 and the hydrophobic layer 443 via chemical vapor deposition.

Figure 5A:
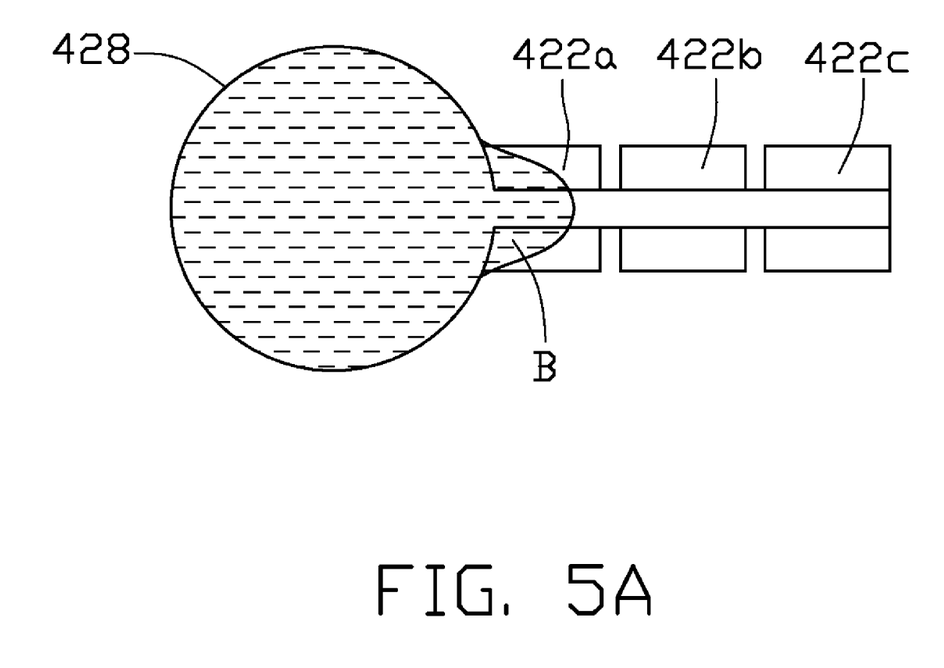
FIGS. 5A-5C are explanation views showing steps for generating a fluid droplet.
Figure 5B:
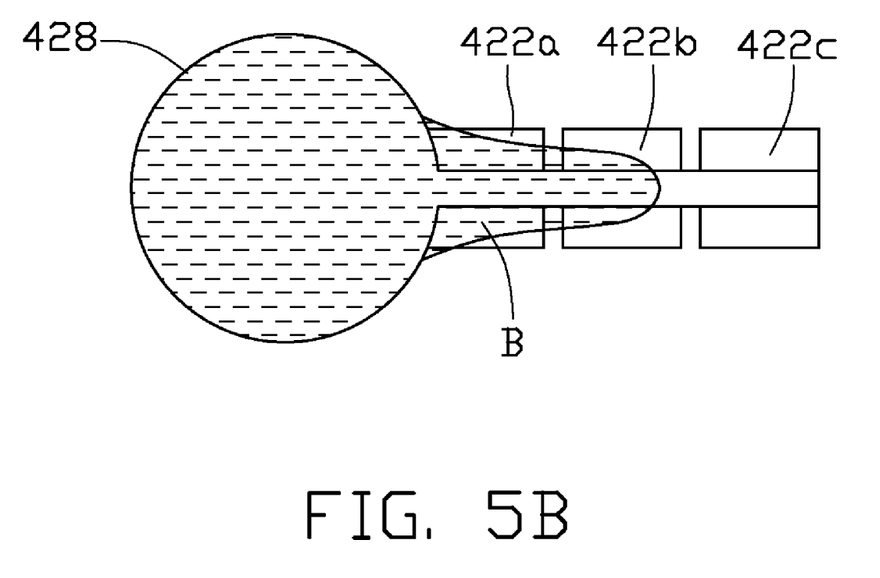
Figure 5C:
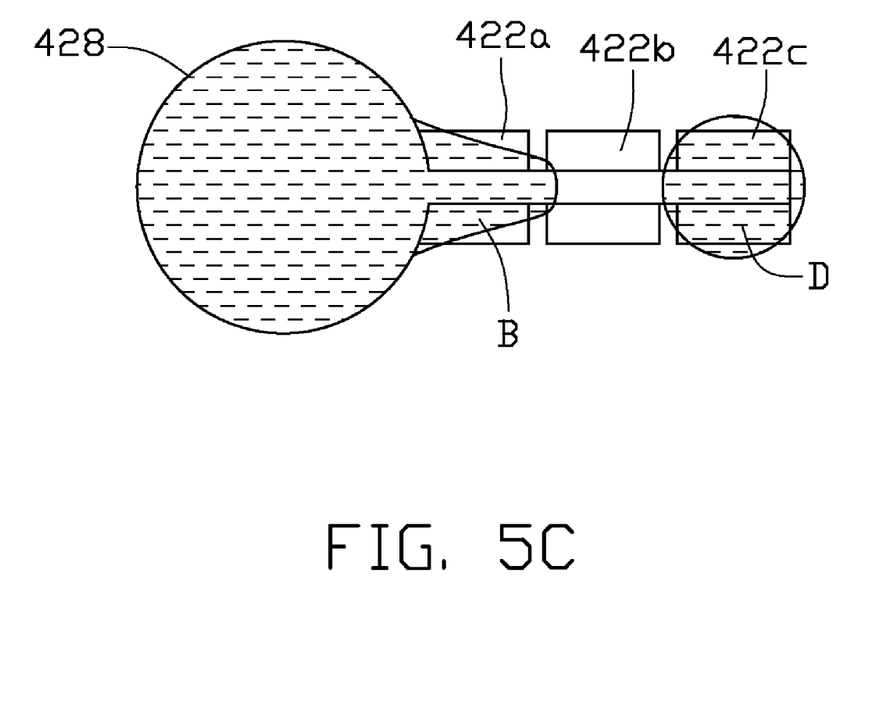
Figure 7A:
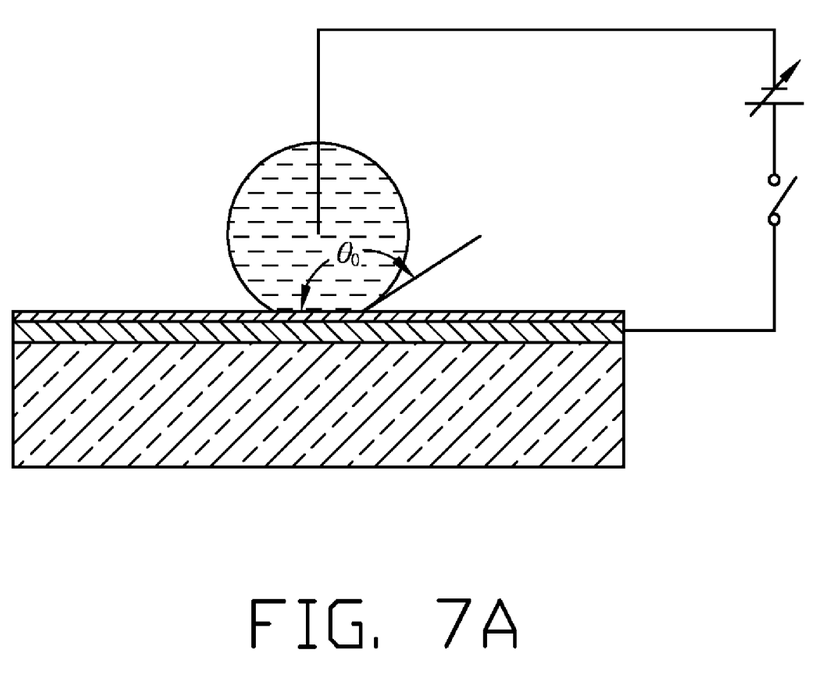
FIGS. 7A-7B are explanation views showing a principle of an EWOD efficiency.
Figure 7B:
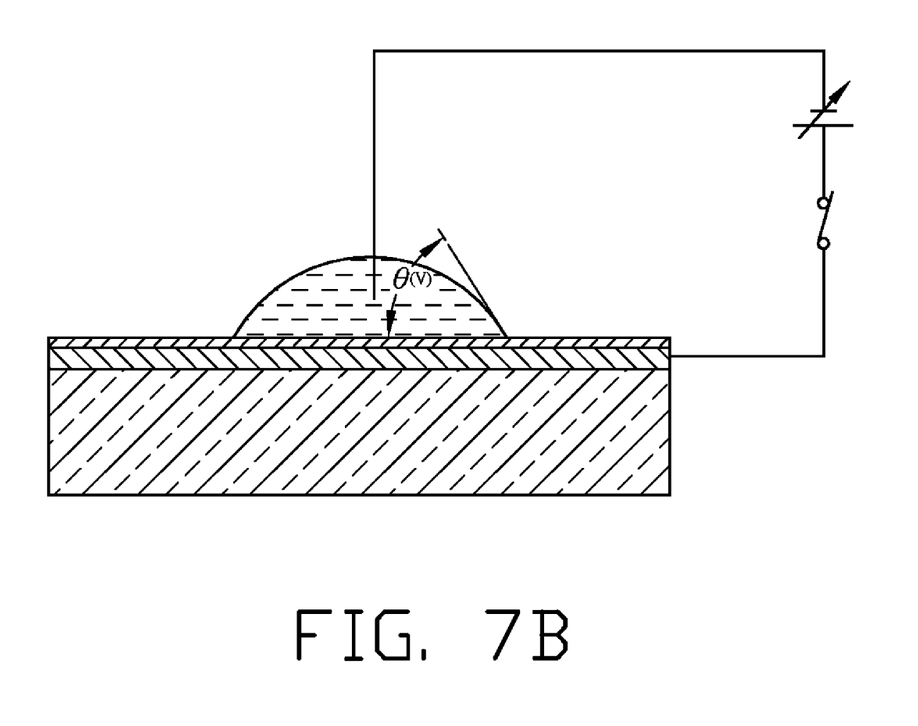

Referring to FIGS. 5A to 5C, during operation of the droplet generator 40, a fluid segment B is wicked into the left end of the fluid slot 429 and under the control electrode 422a. A voltage is applied to the control electrode 422a by the control circuits. Therefore, the surface tension of a front side of the fluid segment B varies due to EWOD (electrowetting-on-dielectric) effect. Referring to FIGS. 7A and 7B, the EWOD effect is a phenomenon where a contact angle of a front or a rear side of a fluid segment or a fluid droplet varies when a voltage is applied on the front or the rear side of the fluid droplet, whilst a contact angle of the other side of the fluid segment/the fluid droplet remains as before. Therefore, the contact angles of the front and rear sides of the fluid segment/the fluid droplet are different from each other, which causes a difference between surface tensions of the front and rear sides of the fluid droplet/fluid segment to be generated. The difference between the surface tensions drives the fluid segment to move towards a place having higher voltage. That is, the fluid segment B moves from the fluid storage pool 428 towards a portion of the fluid channel 425 corresponding to the control electrode 422a. When a front of the fluid segment B moves under the control electrode 422b, a voltage from the control circuits is applied to the control electrode 422b. The fluid segment B moves from the portion of the fluid channel 425 corresponding to the control electrode 422a towards a portion of the fluid channel 425 corresponding to the control electrode 422b. When the front of the fluid segment B moves under the control electrode 422c, a voltage from the control circuits is applied to the control electrode 422c and the voltage applied to the control electrode 422b is cut off. At this time, the front of the fluid segment B is driven to move towards a portion of the fluid channel 425 corresponding to the control electrode 422c, whilst a rear of the fluid segment B is driven to move towards a portion of the fluid channel 425 corresponding to the control electrode 422a. The fluid segment B is cut into two parts and the fluid droplet D is generated.

Figure 6A:
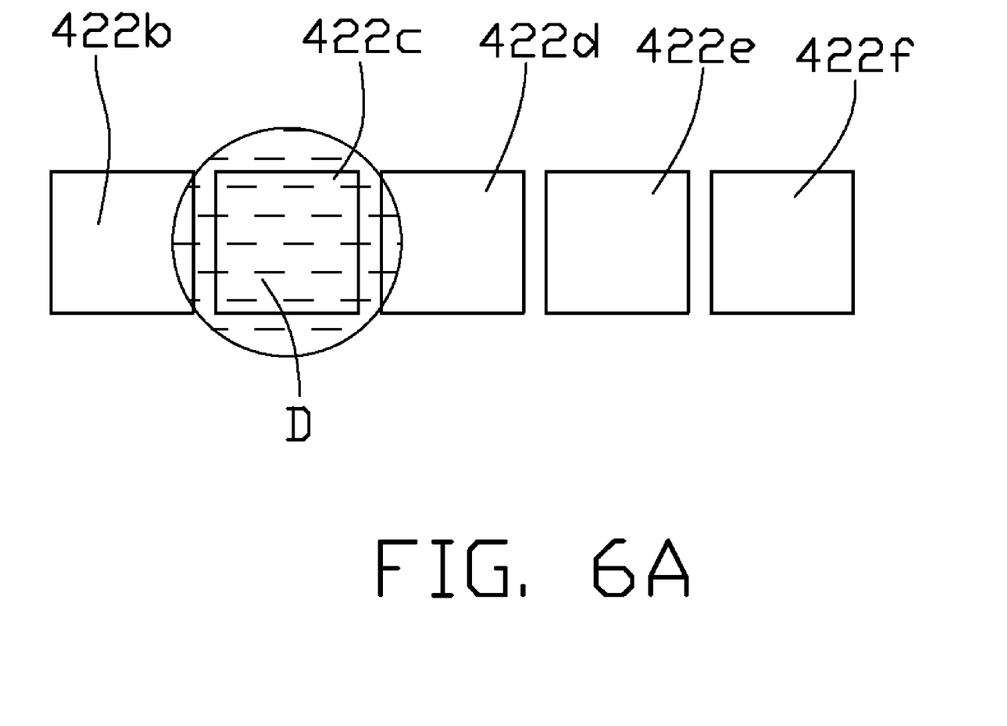
FIGS. 6A-6C are explanation views showing movements of the fluid droplet.
Figure 6B:
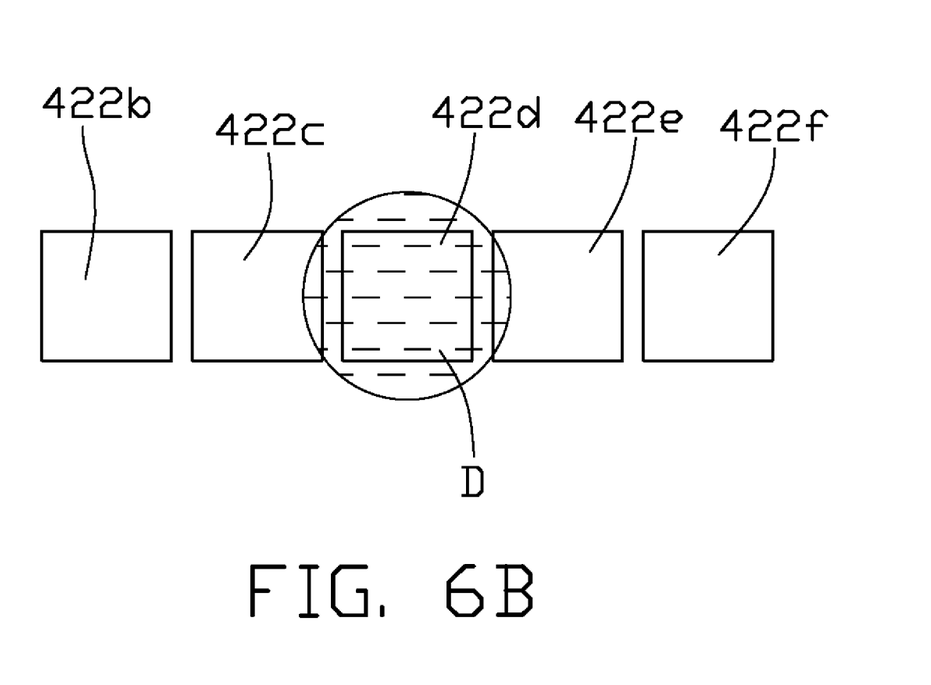
Figure 6C:
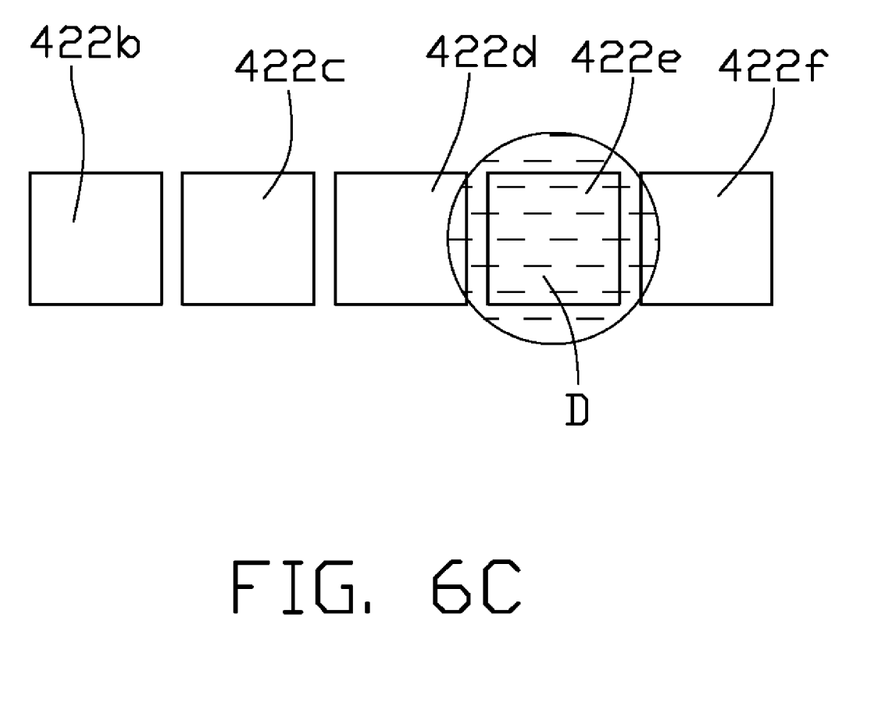

Referring to FIGS. 6A to 6C, the fluid droplet D continues to move towards the control electrode 422c. When a front of the fluid droplet D moves under the control electrode 422d, a voltage from the control circuits is applied to the control electrode 422d and the voltage applied to the control electrode 422c is cut off. The fluid droplet D is driven to move towards the control electrode 422d. When the front of the fluid droplet D moves under the control electrode 422e, a voltage from the control circuits is applied to the control electrode 422e and the voltage applied to the control electrode 422d is cut off. The fluid droplet D continues to move towards the control electrode 422e. The voltage is regularly applied to the control electrodes 422d, 422e, 422f, etc. and regularly cut off from the control electrodes 422c, 422d, 422e, etc. in that order. The fluid droplet D is driven to move towards the right end of the fluid slot 429 and enters into the outlet 491 of the droplet generator 40 defined in the second sealing block 49. Hereinabove description only shows a movement of one fluid droplet D; actually, there are many more fluid droplets D moving at the same time, so that there is many more fluid droplets D continuously entering into the second sealing block 49. When there is enough working fluid in the second sealing block 49, the working fluid is pressed out of the second sealing block 49 and moves towards the heat dissipater 30. After releasing heat through the heat dissipater 30, the working fluid enters the heat absorber 20 to absorb heat from the heat generating electronic component. Then, the working fluid returns to the droplet generator 40 and circulates in the liquid cooling device 200 to continuously absorb heat from the heat absorber 20 and dissipate the heat to the surrounding environment via the heat dissipater 30. Therefore, the heat generated from the heat generating electronic component is dissipated. In the shown embodiment, the working fluid circulates clockwise through the liquid cooling device 200 as viewed from FIG. 1. Alternatively, the working fluid can circulate counterclockwise as viewed from FIG. 1, when the orientation of the droplet generator 40 is reversed with the outlet 491 connecting with the heat absorber 20 and the inlet 481 connecting with the heat dissipater 30.

In the present liquid cooling device 200, the droplet generator 40 functions as the pump of the liquid cooling device 200 and drives the working fluid circulating in the liquid cooling device 200. The droplet generator 40 occupies a small size, which decreases the size of the entire liquid cooling device 200 in such a way that the liquid cooling device 200 can be used in compact electronic products such as laptop computers. The droplet generator 40 drives the working fluid circulating in the liquid cooling device 200 via continuously generating fluid droplets D under EWOD efficiency. There is no noise generated during the operation of the liquid cooling device. Therefore, a quiet working environment is obtained.

In the present liquid cooling device 200, the first and the second sealing blocks 48, 49, and the supporting members 46 are separately formed with the bottom electrode plate 42 and the top electrode plate 44. Alternatively, the first and the second sealing blocks 48, 49, and the supporting members 46 can be integrally formed with the bottom electrode plate 42 or the top electrode plate 44 from a single piece. If the first and the second sealing blocks 48, 49 are integrally formed with the bottom electrode plate 42, there is no need to define the first and the second openings 426, 427 in the bottom electrode plate 42. In the present liquid cooling device 200, the droplet generator 40 has the liquid storage pool 428 disposed between the first sealing block 48 and the fluid slot 429. Alternatively, the liquid storage pool 428 can be omitted, which allows the inlet 481 of droplet generator 40 defined in the first sealing block 48 to directly communicate with the left end of the fluid channel 425. In the present liquid cooling device 200, the working fluid enters into and pours out of the droplet generator 40 via the inlet 481 and the outlet 491 respectively defined in the first sealing block 48 and the second sealing block 49. Alternatively, the inlet and outlet 481, 491 in the first and the second sealing blocks 48, 49 can be omitted. In that situation, the working fluid can enter into and pour out of the droplet generator 40 via inlet and outlet defined in the top electrode plate 44. In the present liquid cooling device 200, the top electrode plate 44 is supported on the bottom electrode plate 42 via the supporting members 46. Alternatively, the supporting members 46 can be canceled. In that situation, the top electrode plate 44 directly and hermetically contacts with the bottom electrode plate 42. The fluid channel 425 is defined in the bottom electrode plate 42.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A droplet generator for use in a liquid cooling device to cool a heat generating electronic component, the liquid cooling device having a heat absorber for thermally connecting with the heat generating electronic component and a heat dissipater for dissipating heat generated by the heat generating electronic component, the droplet generator comprising:
    a bottom electrode plate;
    a top electrode plate hermetically covering the bottom electrode plate;
    a fluid channel formed between the top electrode plate and the bottom electrode plate, said fluid channel having an inlet adapted for connecting with one of the heat absorber and the heat dissipater, and an outlet adapted for connecting with the other one of the heat absorber and the heat dissipater;
    two supporting members disposed at two opposite sides of the fluid channel and hermetically supporting the top electrode plate on the bottom electrode plate; and
    a plurality of control electrodes disposed between the top electrode plate and the bottom electrode plate, the control electrodes being arranged between the inlet and the outlet of the droplet generator, voltages being regularly applied on the control electrodes so as to generate a plurality of fluid droplets and drive the fluid droplets to move from the inlet towards the outlet of the droplet generator.

2. The droplet generator as described in claim 1, further comprising two sealing blocks hermetically disposed at two opposite ends of the droplet generator, the inlet and the outlet of the droplet generator being respectively defined in the sealing blocks.

3. The droplet generator as described in claim 1, wherein the bottom electrode plate defines an elongate tiny fluid slot configured for wicking a fluid segment into the fluid channel.

4. The droplet generator as described in claim 3, wherein the fluid slot divides each of the control electrodes into three parts.

5. The droplet generator as described in claim 3, wherein the bottom electrode plate defines a fluid storage pool communicating the inlet with an end of the fluid slot.

6. A miniaturized liquid cooling device comprising:
    a heat absorber;
    a heat dissipater;
    a droplet generator driving a working fluid circulating between the heat absorber and the heat dissipater and dividing the working fluid into fluid droplets when the working fluid flows through the droplet generator; and a plurality of tubes connecting the heat absorber, the heat dissipater and the droplet generator with each other;

wherein the droplet generator comprises two sealing blocks hermetically disposed at two opposite ends thereof, the droplet generator having inlet and outlet being respectively defined in the sealing blocks.

7. The miniaturized liquid cooling device as described in claim 6, wherein the droplet generator comprises a bottom electrode plate, a top electrode plate and two supporting members disposed at two opposite sides of a fluid channel defined through the droplet generator, the two supporting members hermetically supporting the top electrode plate on the bottom electrode plate.

8. The miniaturized liquid cooling device as described in claim 7, wherein the droplet generator has a plurality of control electrodes disposed between the top electrode plate and the bottom electrode plate, the control electrodes being arranged in the fluid channel and between the inlet and the outlet of the droplet generator, voltages being regularly applied on the control electrodes so as to generate the fluid droplets and drive the fluid droplets to move from the inlet towards the outlet of the droplet generator.

9. The miniaturized liquid cooling device as described in claim 8, wherein the control electrodes respectively connect with a plurality of electric terminals via a plurality connecting units, the electric terminals being disposed outside the supporting members.

10. The miniaturized liquid cooling device as described in claim 8, wherein the bottom electrode plate defines an elongated, tiny fluid slot configured for wicking a fluid segment into the fluid channel.

11. The miniaturized liquid cooling device as described in claim 10, wherein the fluid slot divides each of the control electrodes into three parts.

12. The miniaturized liquid cooling device as described in claim 10, wherein the bottom electrode plate defines a fluid storage pool communicating the inlet of the droplet generator with an end of the fluid slot.

13. A droplet generator for use in a liquid cooling device to cool a heat generating electronic component, the liquid cooling device having a heat absorber for thermally connecting with the heat generating electronic component and a heat dissipater for dissipating heat generated by the heat generating electronic component, the droplet generator comprising:

a bottom electrode plate;

a top electrode plate hermetically covering the bottom electrode plate;

a fluid channel formed between the top electrode plate and the bottom electrode plate, said fluid channel having an inlet adapted for connecting with one of the heat absorber and the heat dissipater, and an outlet adapted for connecting with the other one of the heat absorber and the heat dissipater; and a plurality of control electrodes disposed between the top electrode plate and the bottom electrode plate, the control electrodes being arranged between the inlet and the outlet of the droplet generator, voltages being regularly applied on the control electrodes so as to generate a plurality of fluid droplets and drive the fluid droplets to move from the inlet towards the outlet of the droplet generator;

wherein the bottom electrode plate defines an elongate tiny fluid slot configured for wicking a fluid segment into the fluid channel; and wherein the bottom electrode plate defines a fluid storage pool communicating the inlet with an end of the fluid slot.

14. The droplet generator as described in claim 13, wherein the fluid slot divides each of the control electrodes into three parts.

* * * * *